United States Patent
Jung et al.

(10) Patent No.: US 9,070,869 B2
(45) Date of Patent: Jun. 30, 2015

(54) FABRICATION METHOD FOR HIGH-DENSITY MRAM USING THIN HARD MASK

(71) Applicant: Avalanche Technology Inc., Fremont, CA (US)

(72) Inventors: Dong Ha Jung, Pleasanton, CA (US); Kimihiro Satoh, Beaverton, OR (US); Jing Zhang, Los Altos, CA (US); Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 77 days.

(21) Appl. No.: 14/051,327

(22) Filed: Oct. 10, 2013

(65) Prior Publication Data

US 2015/0104882 A1    Apr. 16, 2015

(51) Int. Cl.
 *H01L 21/00* (2006.01)
 *H01L 43/12* (2006.01)
 *H01L 27/22* (2006.01)

(52) U.S. Cl.
 CPC .............. *H01L 43/12* (2013.01); *H01L 27/222* (2013.01)

(58) Field of Classification Search
None
See application file for complete search history.

(56) References Cited

U.S. PATENT DOCUMENTS

| | | | |
|---|---|---|---|
| 8,450,119 B2 | 5/2013 | Torng et al. | |
| 2005/0020076 A1* | 1/2005 | Lee et al. | 438/689 |
| 2007/0014149 A1* | 1/2007 | Nagamine et al. | 365/158 |
| 2007/0020934 A1* | 1/2007 | Gaidis et al. | 438/689 |
| 2009/0224331 A1* | 9/2009 | Aoki | 257/379 |
| 2009/0256220 A1* | 10/2009 | Horng et al. | 257/421 |
| 2009/0302404 A1* | 12/2009 | Matsuda et al. | 257/421 |
| 2010/0020592 A1* | 1/2010 | Hosotani et al. | 365/158 |
| 2010/0276768 A1* | 11/2010 | Gaidis | 257/421 |
| 2011/0198314 A1* | 8/2011 | Wang et al. | 216/22 |
| 2012/0028373 A1* | 2/2012 | Belen et al. | 438/3 |
| 2012/0074511 A1* | 3/2012 | Takahashi et al. | 257/427 |
| 2013/0241015 A1 | 9/2013 | Nomachi | |
| 2013/0244192 A1* | 9/2013 | He et al. | 432/9 |

(Continued)

OTHER PUBLICATIONS

Keizo Kinoshita, et al.; "Damage Recovery by Reductive Chemistry after Methanol-Based Plasma Etch to Fabricate Magnetic Tunnel Junctions"; Japanese Journal of Applied Physics. Aug. 2012; 51:08HA01; Published online Aug. 20, 2012; http://dx.doi.org/10.1143/JJAP.51.08HA01.

(Continued)

*Primary Examiner* — Charles Garber
*Assistant Examiner* — Evren Seven
(74) *Attorney, Agent, or Firm* — G. Marlin Knight; Bing K. Yen (57) ABSTRACT

Embodiments of the invention are described that use a thin metallic hard mask, which can be a bi-layer film, to increase the incident IBE angle for MTJ sidewall cleaning without losing the process margin for the subsequent interconnection process. The patterned metallic hard mask pads also serve as the top electrode for the MTJ cells. Using a thin metallic hard mask is possible when the hard mask material acts as a CMP stopper without substantial loss of thickness. In the first embodiment, the single layer hard mask is preferably ruthenium. In the second embodiment, the lower layer of the bi-layer hard mask is preferably ruthenium. The wafer is preferably rotated during the IBE process for uniform etching. A capping layer under the hard mask is preferably used as the etch stopper during hard mask etch process in order not to damage or etch through the upper magnetic layer.

19 Claims, 10 Drawing Sheets

(56) References Cited

U.S. PATENT DOCUMENTS

| | | | |
|---|---|---|---|
| 2013/0316536 A1* | 11/2013 | Seto et al. | 438/689 |
| 2014/0070344 A1* | 3/2014 | Khalili et al. | 257/421 |
| 2014/0087483 A1* | 3/2014 | Ohsawa et al. | 438/3 |
| 2014/0170776 A1* | 6/2014 | Satoh et al. | 438/3 |
| 2014/0170778 A1* | 6/2014 | Ikeda | 438/3 |
| 2014/0227801 A1* | 8/2014 | Hsu et al. | 438/3 |
| 2014/0227802 A1* | 8/2014 | Hsu et al. | 438/3 |
| 2014/0227804 A1* | 8/2014 | Hsu et al. | 438/3 |
| 2014/0284736 A1* | 9/2014 | Toko et al. | 257/421 |

OTHER PUBLICATIONS

Sugiura, Kuniaki; et al.; "Ion Beam Etching Technology for High-Density Spin Transfer Torque Magnetic Random Access Memory"; Japanese Journal of Applied Physics. Aug. 2012; vol. 48, Issue 8, pp. 08HD02-08HD02-3 (2009); Published online Aug. 20, 2009; http://dx.doi.org/10.1143/JJAP.48.08HD02.

\* cited by examiner

FABRICATION METHOD FOR HIGH-DENSITY MRAM USING THIN HARD MASK

FIELD OF THE INVENTION

The present invention relates generally to designs and fabrication methods for non-volatile magnetic random access memory (MRAM) and particularly to methods for fabricating resistive memory cells in high density arrays incorporating a small feature size with minimized pitch for magnetic tunnel junction (MTJ).

BACKGROUND

The memories such as RRAM (Resistive Random Access Memory), PRAM (Phase Change Random Access Memory) and MRAM (Magnetic Random Access Memory) have a resistive device as a memory element. The high speed access and the non-volatility at power off of these devices make these promising technologies to replace existing memories.

The resistive memory devices consisting of a top electrode, a bottom electrode and the resistive memory element in between are fabricated in an array of pillar shapes on a wafer using a conventional lithography and dry etching process. A memory element MTJ (Magnetic Tunnel Junction) in an MRAM cell includes at least a pinned layer, a free layer and barrier (or junction) layer separating the pinned and free layers. The conventional patterning processes for MRAM cells includes hard mask patterning, top electrode patterning, MTJ patterning and bottom electrode patterning processes. As the device size shrinks and the cell array becomes denser, the conventional method for MTJ etching is reaching its limit in process capabilities. MTJ reactive ion etching (RIE) can result clean in sidewalls without re-deposited material across the barrier layer. However, the presence of reactive ion species during etching results in chemical reactions with MTJ layers at the sidewall of the MTJ pillar which possibly degrades and damages the magnetic properties. The presence of the damaged material may not be important when the size of the damaged area is minor compared to the non-damaged portion inside the MTJ pillar. However, the decrease of the MTJ feature size increases the total ratio of the damaged MTJ and can result in loss of the magnetic properties and increased magnetic property variation across the wafer as well.

The ion beam etching (IBE) process which is well established in the magnetic head industry could be another option for the MTJ etching because the IBE process is known to be free of chemical reactions. However, the IBE process can be applied to the small feature size MTJ with low density but not for the high density arrays with limited pitch between two MTJ cells. Eliminating re-deposition at the MTJ sidewall is one of the key concerns for the IBE process. IBE systems typically include means for mounting a wafer on a rotating stage assembly that can include several axes of rotation that control of the angle of incidence of the ion beam. One of the possible ways to remove the re-deposited material is to etch the sidewall with high incident ion beam angle. However, this IBE angle is limited by the pitch between two adjacent MTJ pillars and the height of the MTJ pillar which includes MTJ stacks and metallic hard mask. The high incident beam angle can be used with the higher pitch, low density MTJ cells but is not usable with the small pitch for the high density MTJ cells. Increased cell density will limit the incident angle and possibly leave re-deposited material at the sidewall.

The required thickness of the hard mask is dependent on the process margin for the subsequent interconnection process. A thicker hard mask will gain more margin for the subsequent interconnection process followed by MTJ etching. However, this thick hard mask will limit the IBE incident beam angle for sidewall cleaning by increasing the height of the pillar.

Figure 1A:
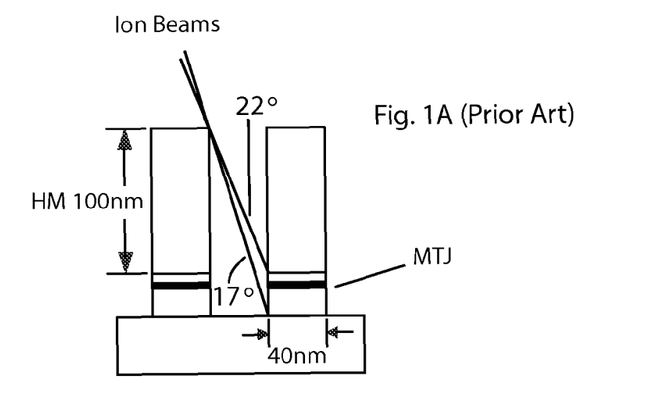
FIGS. 1A-C illustrate a cross sectional view, perpendicular to the substrate surface, of a selected stage of an IBE incident angle with a selected hard mask thickness of 100 nm and different MTJ feature sizes for the high density 2 F pitch MTJ array according to the prior art.

FIG. 1A illustrates a cross sectional view, perpendicular to the substrate surface, at a selected stage during ion beam etching (IBE) process, according to the prior art, of an MTJ MRAM pillars in an array. Note that the incident angle is measured by convention with respect to a line perpendicular to the surface of the substrate. The two ion beam incident angles are measured at the top of the upper magnetic layer and bottom of the MTJ pillar. The width of the pillars (the feature size F) is 40 nm in FIG. 1A, 30 nm in FIG. 1B, and 20 nm in FIG. 1C. The hard mask, which also serves as the top electrode, thickness is 100 nm in each of these figures. With 2 F pitch density of MTJ cells, top electrode hard mask thickness of 100 nm and at the MTJ feature size 40 nm (FIG. 1A), the incident beam angle that can reach the bottom of the pillar will be limited to 17 degrees maximum. FIG. 1C shows that the maximum incident beam angle at the bottom of the pillar decreases to 9 degrees for the 20 nm MTJ feature size. This relatively low angle IBE process will not be sufficient to remove re-deposited and/or damaged materials from the sidewall of the MTJ during etching and could result in shorting failures which will lead to the low yields.

SUMMARY OF THE INVENTION

Embodiments of the invention use a thin metallic hard mask, which can be a bi-layer film, to increase the incident IBE angle for MTJ sidewall cleaning without losing the process margin for the subsequent interconnection process. The patterned metallic hard mask pads also serve as the top electrode for the MTJ cells. The thin metal hard mask, preferably approximately 10-40 nm, will increase the maximum incident angle during the IBE process that can be used to clean the re-deposited material and/or damaged material from the sidewalls of the MTJ pillars that are densely packed on the wafer. Using a thin metallic hard mask is possible when the hard mask material acts as a CMP stopper without substantial loss of thickness. In the first embodiment, the single layer hard mask is preferably ruthenium. In the second embodiment, the lower layer of the bi-layer hard mask is preferably ruthenium. The wafer is preferably rotated during the IBE process for uniform etching.

The MTJ stack and bottom electrode (BE) can be etched using RIE or IBE process to form the pillars. After the MTJ stack and BE are etched, the re-deposited and/or damaged material on the sidewall of the pillars is removed by IBE process. The thin hard mask allows the incident angle during IBE process to increase. The increased incident angle during IBE process improves removal the re-deposited material and/or damaged material at the MTJ sidewall. A capping layer under the hard mask is preferably used as the etch stopper during hard mask etch process in order not to damage or etch through the upper magnetic layer.

When the IBE process is completed, a passivation film and inter layer dielectric (ILD) film are deposited. Chemical mechanical polishing (CMP) then exposes the top of the hard mask pads, which serve as the top electrode. Because the removal rate of Ru with the oxide CMP is very low, the preferred thin Ru layer with minimized thickness will act as a CMP stopper without significant loss of its initial thickness. The CMP process for the dielectric and passivation layer is subsequently followed for the bit line interconnection process. Nitride deposition and oxide deposition are followed by CMP process for the bit line interconnection process. Bit line trenches are patterned and metallization process follows.

The second embodiment of the invention uses a bi-layer hard mask film. The lower layer becomes the top electrode pads for the MTJ cells. The material for the upper hard mask layer is selected to have high selectivity in MTJ and/or BE etching ambient and in one embodiment is Ta. The material for the lower hard mask layer is selected to have low removal rate in oxide CMP ambient during interconnection process and is preferably Ru. The upper hard mask is removed during the MTJ/BE etching and subsequent IBE cleaning process is finished. The subsequent process will be identical to the first embodiment and the remaining lower hard mask will act as the CMP stopper.

BRIEF DESCRIPTION OF THE FIGURES

FIGS. 3 to 12 illustrate a cross sectional view, perpendicular to the substrate surface, of selected stages of the fabrication process of MTJ MRAM cells according to the first embodiment of the invention. In FIG. 3 MTJ stack and the hard mask/top electrode is deposited on the control device which is not described herein.

FIGS. 13 to 16 illustrate a cross sectional view, perpendicular to the substrate surface, of selected stages of the fabrication process of MTJ MRAM cells according to the second embodiment of the invention. In FIG. 13 MTJ stack layers and the bi-layer metal hard mask film are deposited on the control device which is not described herein.

DETAILED DESCRIPTION OF THE INVENTION

In the following description of the embodiments, reference is made to the accompanying drawings that form a part hereof, and in which is shown by way of illustration of specific embodiments in which the invention may be practiced. It is to be understood that other embodiments may be utilized without departing from the scope of the present invention. It should be noted that the figures discussed herein are not drawn to scale and thicknesses of lines are not indicative of actual sizes. The cross section view in the figures is generally taken through the approximate center the memory cell in a plane perpendicular to the substrate unless otherwise noted. Although only one to three cells are shown in the figures, the method may be used for the simultaneous fabrication of a many cells in an array on a wafer according to standard techniques.

Figure 2A:
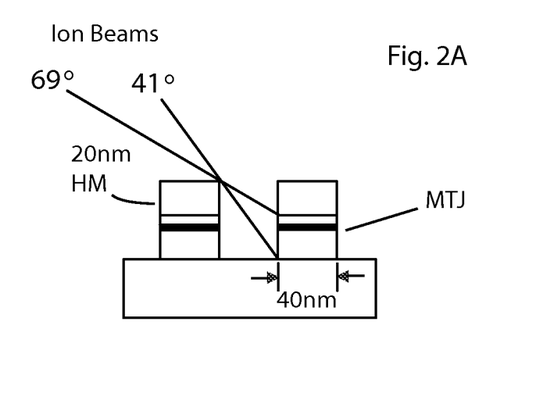
FIGS. 2A-C illustrate a cross sectional view, perpendicular to the substrate surface, of a selected stage of an IBE incident angle with different MTJ feature sizes for the high density 2 F pitch MTJ array and a selected hard mask thickness of 20 nm used in embodiments of the invention.
Figure 2B:
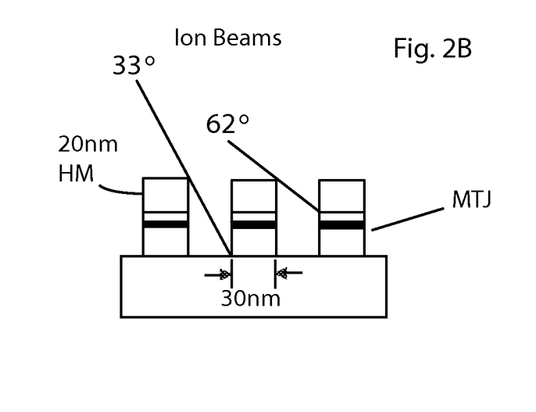
Figure 2C:
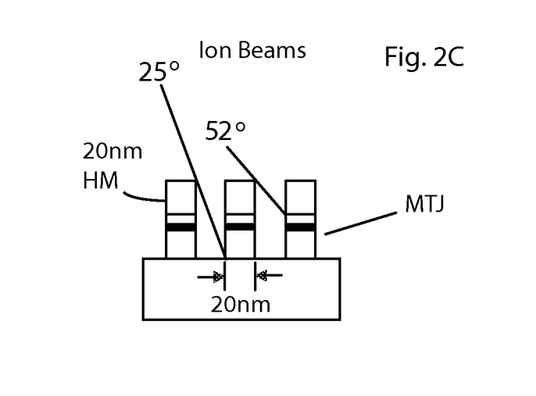

FIGS. 2A-C illustrates how the thin hard mask used in embodiments of the invention allow increased IBE incident angles. The figures show a cross sectional view taken perpendicular to the substrate surface of a selected stage of fabrication of MTJ cells. The IBE incident angle that can be used with a selected hard mask thickness of 20 nm according to an embodiment of the invention and different MTJ feature (F) sizes for the high density 2 F pitch MTJ array. In each of the embodiments described below, a residual pad of hard mask material, which serves as the top electrode, remains on top of the MTJ pillar after patterning. It is the thickness of this residual hard mask pad that is relevant for IBE processing. The examples in the figures use a thickness 20 nm, but the thickness range of this pad in both first and second embodiments is preferably between 10~40 nm. In the second embodiment, which uses a bi-layer, all the upper hard mask will be removed after MTJ etching, therefore, it is the thickness of the remaining lower hard mask layer pad that determines the limit on the IBE angle. The height of the MTJ pillar which includes MTJ itself and BE is estimated as 30 nm.

Figure 1B:
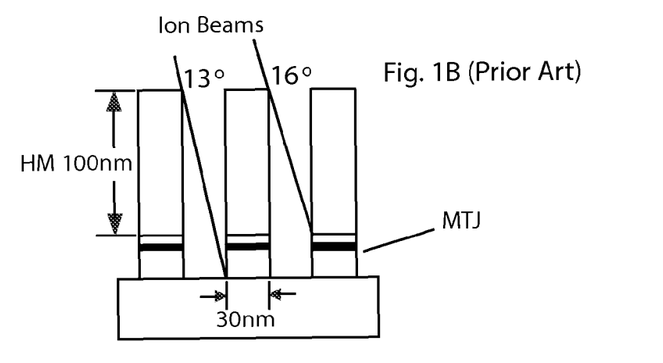
Figure 1C:
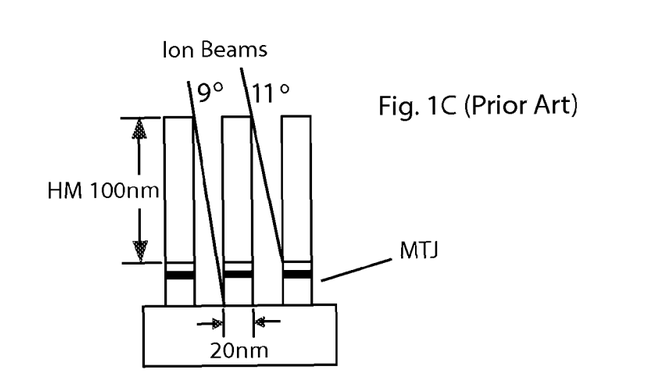

By using a hard mask thickness preferably between 10~40 nm IBE incident angles are substantially increased in comparison to the angles shown in FIGS. 1A-C. For example as shown in FIG. 2C, for a 20 nm feature size, using a hard mask thickness of 20 nm allows for an incident beam angle of 25 degrees to reach to the sidewall of the bottom layer in the MTJ pillar. However, the goal of the IBE is to clean the sidewall of junction layer (typically MgO) of re-deposited material and to remove any chemically damaged portion of the sidewall of the free layer. Therefore, it is not necessarily required that the ion beam reach the sidewall of the entire MTJ pillar. For example, if the free layer is above the junction layer, the IBE can be targeted to where the junction layer and free layer are in the pillar. In this particular case the IBE angle does not have to be restricted to 25 degrees and can be increased to the 52 degree angle illustrated as reaching the upper magnetic layer, which is immediately below the hard mask/top electrode.

First Embodiment

Figure 3:
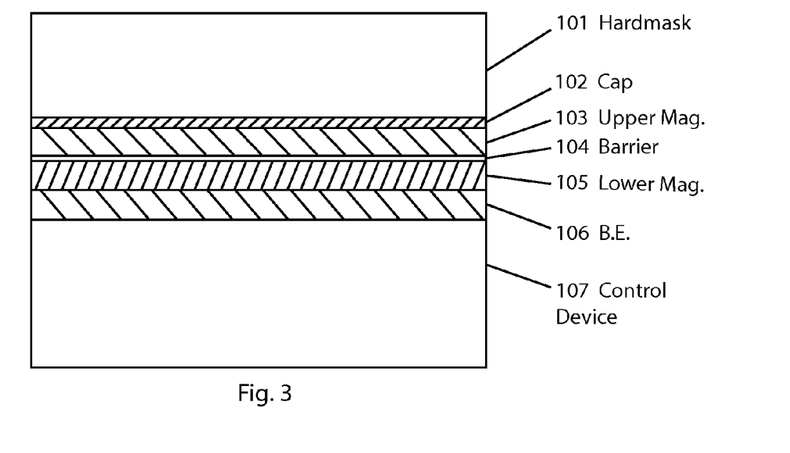

FIGS. 3 to 12 will be used to describe the first embodiment of the invention. FIG. 3 illustrates a selected stage of the MTJ and hard mask deposition process. The hard mask in the first embodiment is a single layer film, but in the second embodiment described below the hard mask includes two layers. As shown in FIG. 3 the MTJ layers have been deposited on the previously patterned control device 107 which is formed using standard techniques and is not described in this disclosure. The multiple layers in the stack for the MRAM cells have been deposited in sequence over the control device 107. The lowest layer in the cell is the bottom electrode (BE) layer 106, which is followed by the multiple layers in the MTJ stack which includes conventional layers such as the free and pinned magnetic layers and the barrier layer 104. Because the magnetic free layer, for example, can be the upper magnetic layer 103 or the lower magnetic layer 105 according to standard MTJ principles, the following description will typically refer only to the upper 103 and lower magnetic layers 105 with the understanding that the invention is not dependent on the design of the MTJ structure. The MTJ is covered with capping layer 102.

In this embodiment the metallic hard mask layer 101 will act as a CMP stopper after the pillars have been overlaid with passivation and dielectric film. The thickness of the hard mask in embodiments of the invention will be thinner than in conventional integration schemes in order to gain enough margins for IBE angle during IBE sidewall cleaning process to remove re-deposited and damaged material from the MTJ sidewall. The material for the hard mask in the first embodiment is preferably ruthenium (Ru), which is chosen because it is very resistant to CMP. Although Ru is preferred, other metallic materials such as Ti, TiN, Ta, TaN, W, Cr have some CMP selectivity over the dielectric, and these materials could be also used for the hard mask layer in alternative embodiments.

Figure 4:
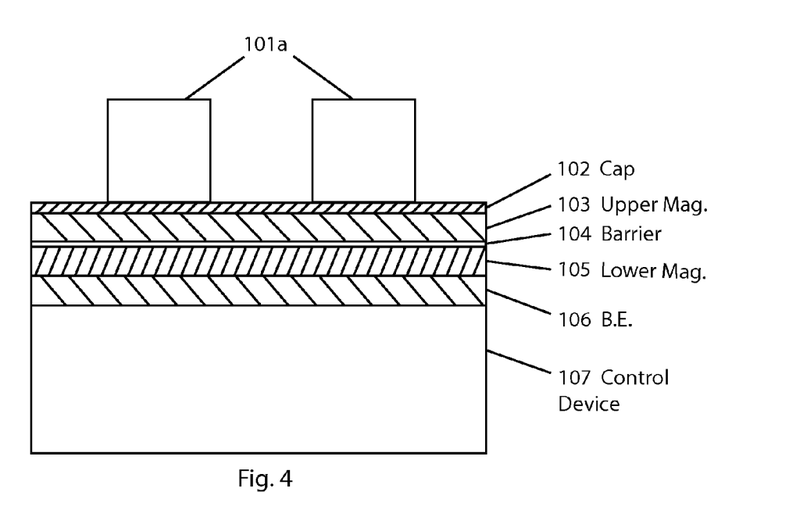
FIG. 4 illustrates a cross sectional view of a process stage subsequent to that of FIG. 3 after the top electrode pads are patterned from the hard mask layer. The hard mask is patterned using a conventional lithography process.

FIG. 4 illustrates a subsequent selected stage in the process after that shown in FIG. 3. A patterning process using conventional photo lithography on the hard mask layer 101 has formed the hard mask pads 101a, which generally correspond to the shape and position of the desired MTJ pillars in the array. Accordingly in a top plan view (not shown) the hard mask pads 101a are arranged in an array corresponding to planned MTJ cell array. The shape of the MTJ pillars in a top plan views are typically elliptical but the invention can be used with any desired shape. The capping layer 102 is used as the etch stopper during hard mask etch process in order not to etch through top magnetic layer 103 which may possibly degrade the magnetic performance. Therefore, the capping layer 102 should be a metallic material which has some selectivity during hard mask layer 101 etch. The hard mask is preferably ruthenium, therefore, Ta, Ti, TiN, TaN, W, WN, Cr, and Al are possible candidates.

Figure 5:
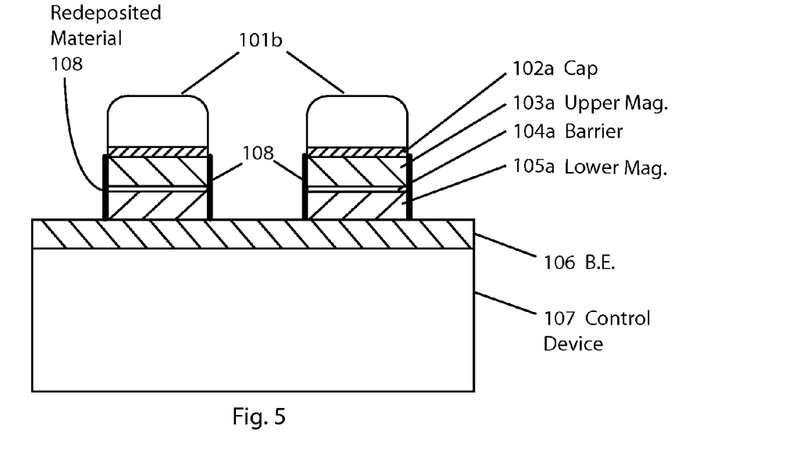
FIG. 5 illustrates a cross sectional view of a process stage subsequent to that of FIG. 4 after the MTJ etching process has been performed.

FIG. 5 illustrates a subsequent selected stage in the process after that shown in FIG. 4. The MTJ layers have been etched until the upper surface of bottom electrode (BE) 106 is fully exposed. The capping layer 102a, top magnetic layer 103a, tunnel barrier layer 104a and bottom magnetic layer 105a are formed by etching either by using reactive ion etching (RIE) or IBE. The metallic hard mask 101b thickness is reduced during the MTJ etching process and unwanted material 108 is formed on the MTJ sidewall. The unwanted material 108 on the sidewall can include etching bi-products that are re-deposited and/or damaged MTJ material. Some sidewall damaged material can be formed by chemical reaction if the MTJ layers are etched using RIE.

Figure 6:
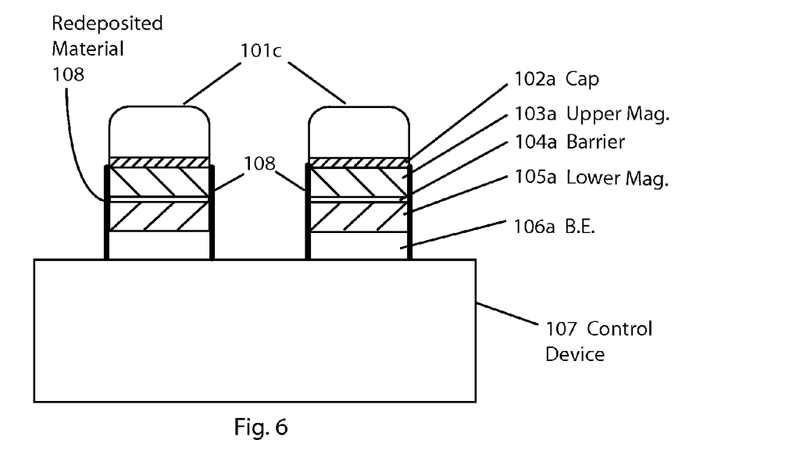
FIG. 6 illustrates a cross sectional view of a process stage subsequent to that of FIG. 5 after the BE etching process has been performed.

BE 106a is etched followed after MTJ etching which is illustrated in FIG. 6. The re-deposited material and/or damaged layer 108 still remains and can even be increased after BE is completely etched. BE etching can be also be performed either by using RIE or IBE. The thickness of the metallic hard mask pads 101c is further reduced during BE etching which possibly increases angle margins for the subsequent IBE process which cleans re-deposited and/or damaged material.

Figure 7:
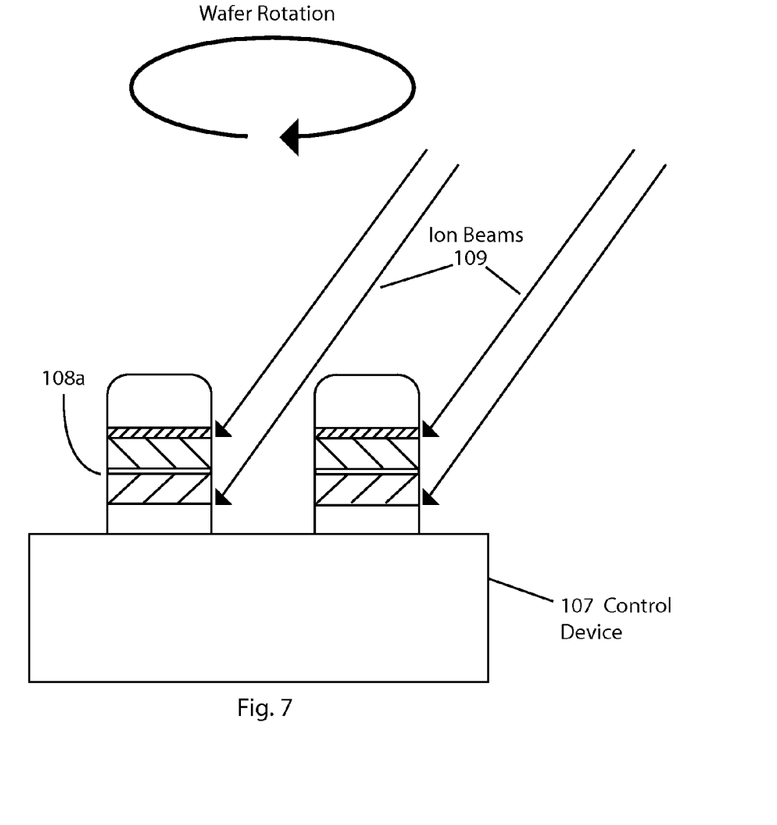
FIG. 7 illustrates a cross sectional view of a process stage subsequent to that of FIG. 6 in which MTJ sidewall cleaning by an IBE process is performed.

FIG. 7 illustrates a subsequent selected stage in the process after that shown in FIG. 6. An IBE process with ion beams 109 with tilted incident angle is used to remove the sidewall re-deposited material and/or damaged layer. The wafer is rotated during the IBE process for the uniform etching. Unlike the conventional process with the thicker hard mask which allows an incident angle up to only 13 degrees with MTJ feature size 30 nm, the IBE incident angle can be increased up to 33 degrees (FIG. 2B) by using the thin ruthenium hard mask, which is almost three times more than the conventional process. This increased IBE angle will give a higher probability of removing all the re-deposited material and/or damaged layer from the side of the MTJ pillar. All the sidewall re-deposited material and/or damaged layer is removed during this stage and the result is the clean MTJ sidewall interface 108a.

Figure 8:
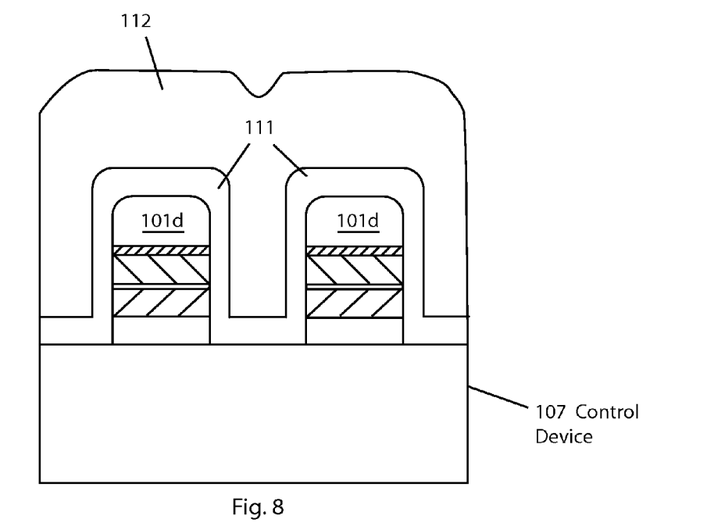
FIG. 8 illustrates a cross sectional view of a process stage subsequent to that of FIG. 7 after the MTJ passivation film and inter metallic dielectric (IMD) film have been deposited.

FIG. 8 illustrates a selected stage of the process subsequent to that shown in FIG. 7. A passivation film 111 has been deposited over the pillar structures on the wafer. A relatively thin film such as silicon nitride (Si3N4) or aluminum oxide (Al2O3) is deposited as a passivation film over the MTJ pillars. The thicker dielectric film 112 is then deposited substantially conform to shape of the pillars and provide fill in between the pillars.

Figure 9:
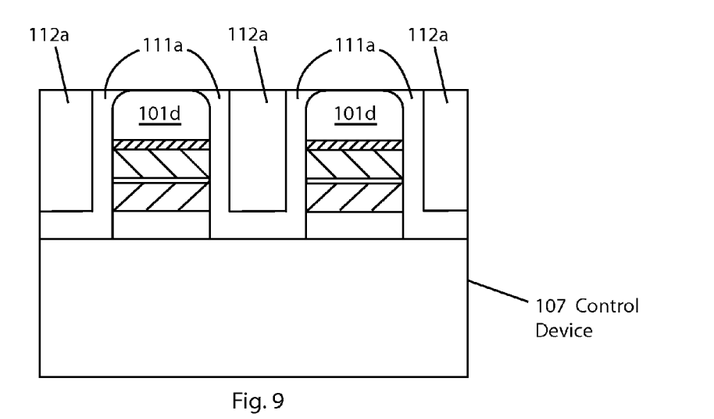
FIG. 9 illustrates a cross sectional view of a process stage subsequent to that of FIG. 8 after the dielectric CMP process has been performed.

FIG. 9 illustrates a selected subsequent stage after a dielectric CMP process has been performed on the wafer. The CMP process stops when the top of the hard mask (Ru) 101d is exposed. The remaining areas of the dielectric layer 112a and the passivation film 111a surround the pillars. Because the removal rate of Ru is very slow within the use of dielectric CMP slurry, no significant loss of the hard mask thickness occurs, which makes it possible to use the thin hard mask for the interconnection process. The hard mask pads 101d serve as the top electrodes for the interconnection process.

Figure 10:
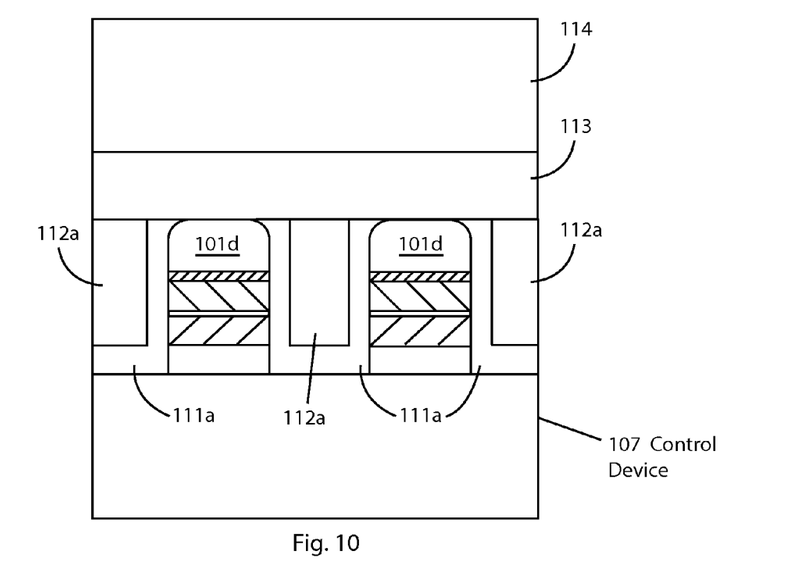
FIG. 10 illustrates a cross sectional view of a process stage subsequent to that of FIG. 9 after a nitride film and inter layer dielectric (ILD) film have been deposited.
Figure 11:
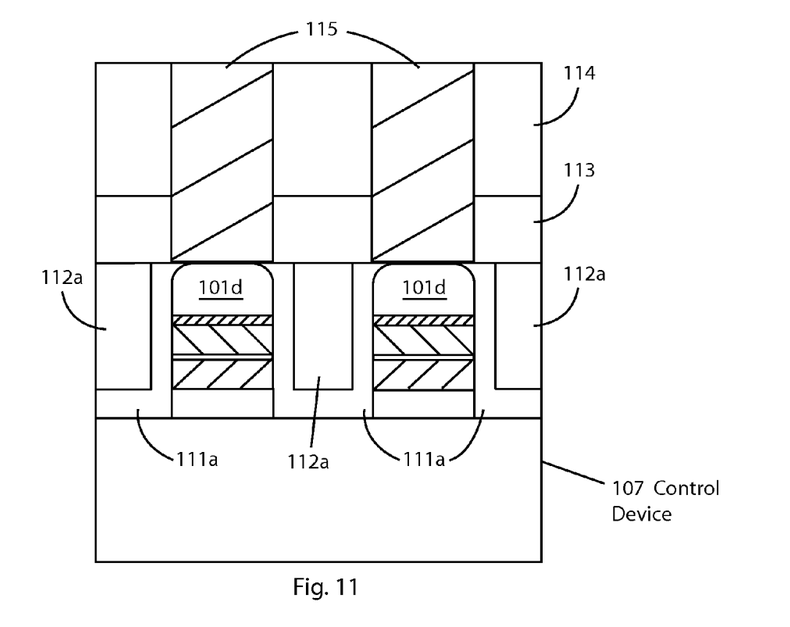
FIG. 11 illustrates a cross sectional view of a process stage subsequent to that of FIG. 10 after the upper metallization fabrication for bit line interconnection using a conventional via-less scheme has been performed.
Figure 12:
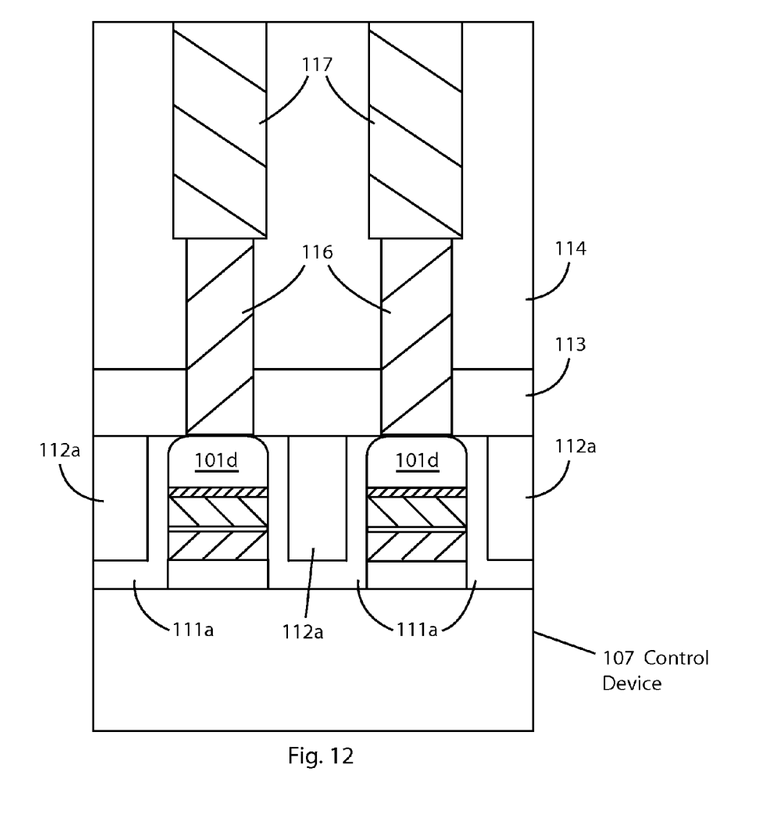
FIG. 12 illustrates a cross sectional view of a process stage subsequent to that of FIG. 11 after the upper metallization fabrication for bit line interconnection using a conventional via has been performed.

In FIG. 10, which illustrates a selected subsequent stage of the process, silicon nitride (Si3N4) film 113 and inter layer dielectric (ILD) film 114 have been deposited for the subsequent interconnection process. FIGS. 11 and 12 illustrate alternative interconnection process by the conventional art. FIG. 11 illustrates a bit line 115 interconnection scheme that does not use a via stud, and FIG. 12 illustrates a bit line 117 interconnection scheme using via stud 116.

Second Embodiment

Figure 13:
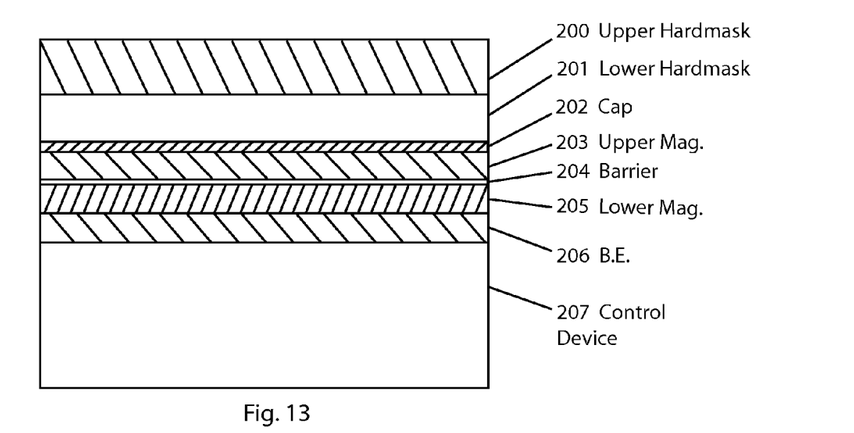
Figure 14:
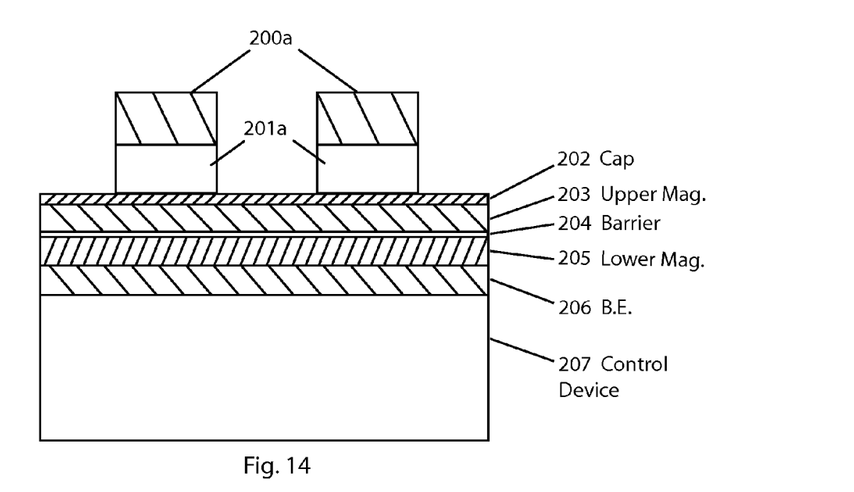
FIG. 14 illustrates a cross sectional view of a process stage subsequent to that of FIG. 13 after the bi-layer hard mask has been patterned. The hard mask is patterned using a conventional lithography process.
Figure 15:
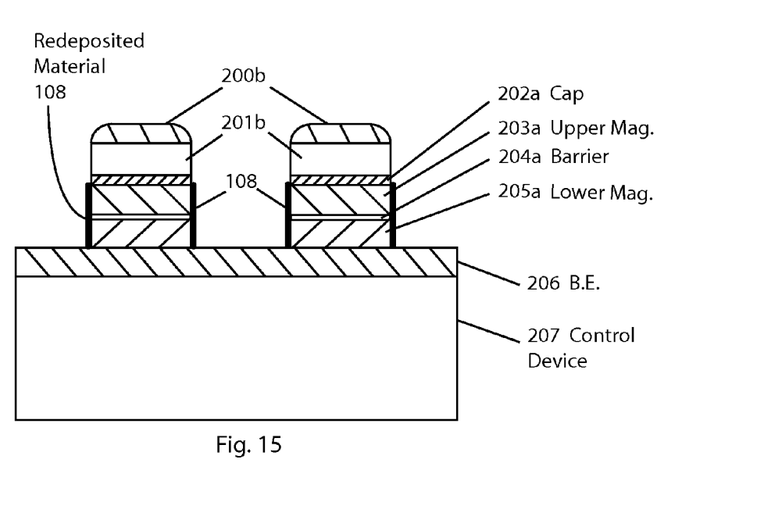
FIG. 15 illustrates a cross sectional view of a process stage subsequent to that of FIG. 14 after the MTJ etching process has been performed.

FIGS. 13 to 15 illustrate the second embodiment of the invention. In this embodiment bi-layer hard mask films are used instead of single hard mask film compared to the first embodiment. The upper layer in the bi-layer hard mask structure is totally removed during processing, but the lower layer becomes the top electrode pads. FIG. 13 illustrates that the MTJ is deposited on the control device 207 which is not described herein. The multiple layers in the stack for the MRAM cell have been deposited in sequence over the control device 207. The lowest layer in the cell is the bottom electrode (BE) layer 206, which is followed by the MTJ stack deposition in the sequence of bottom magnetic layer 205, tunnel barrier layer 204 and top magnetic layer 203. The MTJ is covered with capping layer 202, which should be a metallic material which has some selectivity during hard mask bi-layer etching. The hard mask is preferably ruthenium; therefore, Ta, Ti, TiN, TaN, W, WN, Cr, and Al are possible candidates for the capping layer 202.

The hard mask structure is deposited as a bi-layer stack which is defined as the upper hard mask 200 and the lower hard mask 201. The bi-layer hard mask stack allows minimized initial total hard mask thickness and high selectivity during MTJ and BE etching processes while retaining enough thickness for a top electrode for the BEOL process.

The material for the upper hard mask 200 is selected to have a high etch selectivity during MTJ and BE etching ambient, and tantalum (Ta) can be used in one embodiment. The upper hard mask layer should be a material which has high selectivity in MTJ etching conditions; therefore Ta, TaN, Ti, TiN, W and WN are options. The material for the lower hard mask 201 should have a slow CMP removal rate with dielectric CMP slurry and ruthenium is preferred for this purpose. The total initial thickness of the upper and lower hard mask is thinner than the thickness of the single hard mask layer in the first embodiment. In summary:
    upper hard mask layer 200 (high selectivity in MTJ etching conditions; therefore Ta, TaN, Ti, TiN, W and WN are options);
    lower hard mask layer 201 (slow CMP removal rate with dielectric CMP slurry, ruthenium is preferred); and
    capping layer 202 (etch stop for hard mask, Ta, Ti, TiN, TaN, W, WN, Cr, and Al are options).

The required etching process will vary depending on the particular choices made for the three layers. Although a single etching phase can be used to etch through the upper and lower hard mask layer and stop at capping layer for some combinations, it is also possible to etch the upper and lower hard mask layers in two distinct etching steps using different chemistries. The capping layer can be the same material as the upper hard mask layer because two different etching steps can be used. For example, if the upper hard mask is Ta and the lower hard mask is Ru, the capping layer can also be Ta. The Ta upper hard mask will be etched first using a chemistry which does not etch the Ru, i.e. the Ru is the etch stop. Next a different chemistry will be used to etch the Ru, which does not etch the Ta, i.e. the Ta is the etch stop.

FIG. 14 illustrates a subsequent selected stage in the process after that shown in FIG. 13. A patterning process for the upper 200a and lower hard mask 201a has been performed using conventional photolithography processing that defines the pillar array locations and top view shapes. The capping layer 202 is used as the etch stopper during etch process of the lower hard mask layer in order not to etch through or damage the upper magnetic layer 203 which may possibly degrade the magnetic performance.

Figure 16:
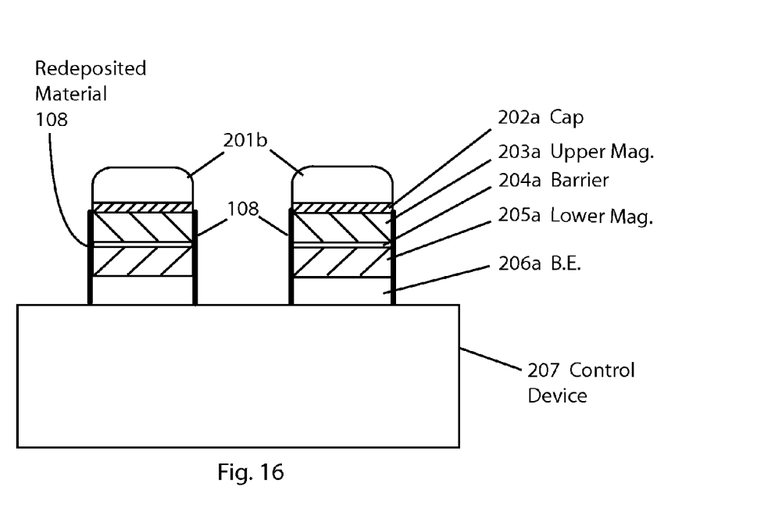
FIG. 16 illustrates a cross sectional view of the process stage subsequent to that of FIG. 15 after the BE etching process has been performed.

FIG. 15 illustrates a subsequent selected stage in the process after that shown in FIG. 14. MTJ layers are etched until the bottom electrode (BE) 206 is fully exposed. The capping layer 202a, top magnetic layer 203a, tunnel barrier layer 204a and lower magnetic layer 205a are etched either by using reactive ion etching (RIE) or IBE. The reduction of the upper hard mask 200b is minimal in this example as the selectivity of the upper hard mask in MTJ etching ambient is very high. However, some of the upper hard mask 200b thickness is reduced during MTJ etching process and bi-products are re-deposited as unwanted material 108 at the MTJ sidewall. Additionally the unwanted material 108 can include damaged material in the sidewalls of the MTJ layers, which can be formed by chemical reaction if the MTJ is etched using RIE. BE etching follows MTJ etching with the result illustrated in FIG. 16. The unwanted material 108 (re-deposited material and/or damaged material) still remains and can even be increased after BE 206a is completely etched. During BE etching all the upper hard mask 200b is removed and only the lower hard mask layer 201b remains with the result being the same structure as the first embodiment after BE etching. Accordingly, the subsequent process is identical to the process described above and illustrated in FIGS. 7 to 13 from first embodiment of the invention and the same structure results.

The invention claimed is:

1. A method for fabricating an array of magnetic memory cells on a wafer comprising:
    depositing a plurality of layers for magnetic memory cells over a wafer, including layers for a bottom electrode, a lower magnetic layer, a junction layer and an upper magnetic layer;
    depositing a capping layer over the plurality of layers for magnetic memory cells;
    depositing a hard mask with at least a first layer of metallic material;
    patterning the hard mask layer into hard mask pads corresponding to the array of magnetic memory cells using the capping layer as an etch stop;
    forming an array of pillars that include the bottom electrodes by etching the plurality of layers for magnetic memory cells using the hard mask pads as a mask;
    cleaning sidewalls of the pillars, including sidewalls of the bottom electrodes, using ion beams with angled incidence while rotating the wafer;
    depositing a conformal passivation layer over the pillars, including the sidewalls of the bottom electrodes;
    depositing an inter-layer dielectric film over the pillars;
    performing chemical mechanical polishing (CMP) on the wafer to expose tops of the hard mask pads through the inter-layer dielectric film, using the hard mask pads as a CMP stopper; and
    performing a bit line interconnection process using the exposed tops of the hard mask pads as top electrodes for the magnetic memory cells.

2. The method of claim 1 wherein the first layer of metallic material in the hard mask layer is ruthenium.

3. The method of claim 2 wherein a feature size of the magnetic memory cells is less than or equal to 40 nm.

4. The method of claim 3 wherein a thickness of the hard mask pads is approximately between 10 nm and 40 nm when the cleaning step begins.

5. The method of claim 1 wherein an angle of incidence of the ion beams is greater than or equal to 25 degrees.

6. The method of claim 5 wherein the angle of incidence of the ion beams is selected to target the junction layer and one of the magnetic layers.

7. The method of claim 1 wherein performing chemical mechanical polishing ends without significant loss of thickness of the hard mask pads.

8. The method of claim 1 wherein the capping layer is Ta, Ti, TiN, TaN, W, WN, Cr, or Al.

9. The method of claim 1 wherein depositing a hard mask further comprises depositing a second layer over the first layer of metallic material.

10. The method of claim 2 wherein depositing a hard mask further comprises depositing a second layer over the first layer of metallic material.

11. The method of claim 10 wherein forming an array of pillars by etching using the hard mask pads as a mask further comprises etching down to the bottom electrode using a first selected set of etching conditions and the second layer has high resistance to the second set of etching conditions.

12. The method of claim 11 wherein the second layer is Ta, TaN, Ti, TiN, W or WN.

13. A method for fabricating an array of magnetic memory cells on a wafer comprising:
- depositing a plurality of layers for magnetic memory cells over a wafer, including layers for a bottom electrode, a lower magnetic layer, a junction layer and an upper magnetic layer;
- depositing a capping layer over the plurality of layers for magnetic memory cells;
- depositing a hard mask with at least a first layer of metallic material;
- patterning the hard mask layer into hard mask pads corresponding to the array of magnetic memory cells using the capping layer as an etch stop;
- forming an array of pillars by etching using the hard mask pads as a mask;
- cleaning sidewalls of the pillars using ion beams with angled incidence while rotating the wafer;
- depositing an inter-layer dielectric film over the pillars;
- performing chemical mechanical polishing (CMP) on the wafer to expose top of the hard mask pads through the inter-layer dielectric film, using the hard mask pads as a CMP stopper; and
- performing a bit line interconnection process using the exposed top of the hard mask pads as top electrodes for the magnetic memory cells,
- wherein the first layer of metallic material in the hard mask layer is ruthenium, depositing a hard mask further comprises depositing a second layer over the first layer of metallic material, patterning the hard mask layer into hard mask pads further comprises etching down to the first layer using a first selected set of etching conditions using the first layer as an etch stop and etching down to the capping layer using a second selected set of etching conditions using the capping layer as an etch stop.

14. The method of claim 13 wherein the second layer is tantalum and the capping layer is tantalum.

15. A method for fabricating an array of magnetic memory cells on a wafer comprising:
- depositing a plurality of layers for magnetic memory cells over a wafer, including layers for a bottom electrode, a lower magnetic layer, a junction layer and an upper magnetic layer;
- depositing a capping layer over the plurality of layers for magnetic memory cells;
- depositing a hard mask with at least a first layer of metallic material;
- patterning the hard mask layer into hard mask pads corresponding to the array of magnetic memory cells using the capping layer as an etch stop;
- forming an array of pillars by etching using the hard mask pads as a mask;
- cleaning sidewalls of the pillars using ion beams with angled incidence while rotating the wafer;
- depositing an inter-layer dielectric film over the pillars;
- performing chemical mechanical polishing (CMP) on the wafer to expose top of the hard mask pads through the inter-layer dielectric film, using the hard mask pads as a CMP stopper; and
- performing a bit line interconnection process using the exposed to of the hard mask pads as top electrodes for the magnetic memory cells,
- wherein the first layer of metallic material in the hard mask layer is ruthenium, depositing a hard mask further comprises depositing a second layer over the first layer of metallic material, the second layer of the hard mask has been removed before the step of cleaning sidewalls of the pillars.

16. The method of claim 1 wherein cleaning sidewalls of the pillars removes unwanted material re-deposited during the step of forming an array of pillars by etching.

17. The method of claim 10 wherein patterning the hard mask layer into hard mask pads further comprises etching down to the first layer using a first selected set of etching conditions using the first layer as an etch stop and etching down to the capping layer using a second selected set of etching conditions using the capping layer as an etch stop.

18. The method of claim 17 wherein the second layer is tantalum and the capping layer is tantalum.

19. The method of claim 10 wherein the second layer of the hard mask has been removed before the step of cleaning sidewalls of the pillars.

* * * * *